(12) United States Patent
Singh

(10) Patent No.: US 8,520,360 B2
(45) Date of Patent: Aug. 27, 2013

(54) ELECTROSTATIC CHUCK WITH WAFER BACKSIDE PLASMA ASSISTED DECHUCK

(75) Inventor: Harmeet Singh, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 155 days.

(21) Appl. No.: 13/185,968

(22) Filed: Jul. 19, 2011

(65) Prior Publication Data

US 2013/0021717 A1    Jan. 24, 2013

(51) Int. Cl.
*H01L 21/687* (2006.01)
(52) U.S. Cl.
USPC .......................................................... 361/234
(58) Field of Classification Search
USPC .......................................................... 361/234
See application file for complete search history.

(56) References Cited

U.S. PATENT DOCUMENTS

| | | | |
|---|---|---|---|
| 5,838,528 A | 11/1998 | Os et al. | |
| 5,858,879 A | 1/1999 | Chao et al. | |
| 6,320,736 B1 | 11/2001 | Shamouilian et al. | |
| 6,452,775 B1 | 9/2002 | Nakajima | |
| 6,793,767 B2 | 9/2004 | Chu et al. | |
| 6,847,014 B1 | 1/2005 | Benjamin et al. | |
| 7,156,951 B1 | 1/2007 | Gao et al. | |
| 7,196,896 B2 | 3/2007 | Howald et al. | |
| 7,782,591 B2 | 8/2010 | Cho et al. | |
| 7,892,445 B1 | 2/2011 | Wei et al. | |
| 2003/0236004 A1 | 12/2003 | Sung et al. | |
| 2004/0261721 A1 | 12/2004 | Steger | |
| 2006/0046506 A1* | 3/2006 | Fukiage | 438/758 |
| 2006/0087793 A1* | 4/2006 | Kim et al. | 361/234 |
| 2008/0186647 A1 | 8/2008 | Kawajiri et al. | |
| 2010/0248490 A1 | 9/2010 | McMillin et al. | |
| 2011/0058302 A1 | 3/2011 | Valcore, Jr. et al. | |
| 2011/0060442 A1* | 3/2011 | Valcore et al. | 700/103 |
| 2011/0092072 A1 | 4/2011 | Singh et al. | |
| 2011/0147338 A1 | 6/2011 | Lin et al. | |

OTHER PUBLICATIONS

International Search Report and Written Opinion mailed Sep. 18, 2012 for PCT/US2012/046066.

* cited by examiner

*Primary Examiner* — Jared Fureman
*Assistant Examiner* — Kevin J Comber
(74) *Attorney, Agent, or Firm* — Buchanan Ingersoll & Rooney PC

(57) ABSTRACT

An electrostatic chuck assembly useful in a plasma processing chamber, comprising a support surface on which a semiconductor wafer is supported during processing of the wafer in the chamber, at least one electrostatic clamping electrode which applies an electrostatic clamping force to the wafer on the support surface when an electrostatic clamping voltage is applied to the clamping electrode, at least one outlet in the support surface which delivers a heat transfer gas to an underside of the wafer, at least one gas passage connected to a source of heat transfer gas operable to supply heat transfer gas at a desired pressure to the at least one gas passage, and at least one cavity and plasma generating electrode along the at least one gas passage, the plasma generating electrode operable to form a dechucking plasma in the cavity, the dechucking plasma being effective to neutralize charges on the underside of the wafer and support surface of the electrostatic chuck and thereby reduce a residual sticking force between the wafer and the support surface.

19 Claims, 4 Drawing Sheets

ELECTROSTATIC CHUCK WITH WAFER BACKSIDE PLASMA ASSISTED DECHUCK

FIELD OF THE INVENTION

The invention relates to improvements in electrostatic chuck designs and methods of dechucking wafers.

BACKGROUND

Various chucking arrangements have been developed for clamping wafers during processing thereof in vacuum chambers such as plasma etch chambers. One challenge has been the residual sticking force between the wafer and the chuck during dechucking operations. Thus, there is a need for improved chuck designs and methods of dechucking which address the sticking problem.

SUMMARY

Disclosed herein is a method of dechucking a wafer held on an electrostatic chuck, incorporated in a lower electrode in a plasma processing chamber, by electrostatic charge. The method comprises clamping a wafer on a support surface of an electrostatic chuck in the plasma processing chamber by applying an electrostatic clamping voltage to the electrostatic chuck, subjecting the wafer to plasma processing while supplying a heat transfer gas at a pressure above 5 Torr to an underside of the wafer, extinguishing the plasma in the chamber and supplying the heat transfer gas at a pressure of 1 to 10 Torr, shutting off the electrostatic clamping voltage, and forming a dechucking plasma in a cavity in the electrostatic chuck and neutralizing charges on the underside of the wafer and support surface of the electrostatic chuck with the dechucking plasma.

Also disclosed herein is an electrostatic chuck assembly useful in a plasma processing chamber, comprising a support surface on which a semiconductor wafer is supported during processing of the wafer in the chamber, at least one electrostatic clamping electrode which applies an electrostatic clamping force to the wafer on the support surface when an electrostatic clamping voltage is applied to the clamping electrode, at least one outlet in the support surface which delivers a heat transfer gas to an underside of the wafer, at least one gas passage connected to a source of heat transfer gas operable to supply heat transfer gas at a desired pressure to the at least one gas passage, and at least one cavity and plasma generating electrode along the at least one gas passage, the plasma generating electrode operable to form a dechucking plasma in the cavity, the dechucking plasma being effective to neutralize charges on the underside of the wafer and support surface of the electrostatic chuck and thereby reduce a residual sticking force between the wafer and the support surface.

BRIEF DESCRIPTION OF THE DRAWING FIGURES

DETAILED DESCRIPTION

Electrostatic chucks (ESC) are commonly used to clamp the wafer for providing thermal control of silicon wafer (substrate) during semiconductor fabrication processes. $Al_2O_3$ or AlN ceramic ESCs based on are Johnsen Rahbek (JR) effect, and $Al_2O_3$ Coulombic ESCs are widely used in various processing equipment.

ESC provides a clamping force to hold the wafer when voltage (DC or AC) is applied to the clamp electrodes in the ESC. Upon the removal of the applied voltage, clamp force is expected to go to zero, upon which wafer can be easily removed. Wafer acts as on electrode of a capacitor, the other electrode being the clamp electrode in the ESC in the presence of externally applied electric field (through a power supply). While the wafer is clamped, the small spaces/gap between the wafer and the ESC surface is typically filled with He (usually at pressures between 1-100 Torr) to provide improved heat transfer coefficient relative to just physical contact between the wafer and the ESC.

While under ideal conditions, the clamp force between the wafer and the ESC vanishes completely when the externally applied voltage is turned off, this is not often true under actual conditions. For example, buildup of thin films on the surface of the electrostatic ESC can lead of charge trapping on the surface of the ESC. Such a charge make take longer to dissipate relative to the externally applied field, and can result in a residual sticking force on the wafer even after the applied field is switched off. Buildup of thin films on the ESC surface in etchers can be caused by fluorination of the ESC (ceramic) surface by chamber clean processes. Additionally, by-products from plasma processing can deposit on the ESC surface leading to films capable of trapping charge.

Figure 1:
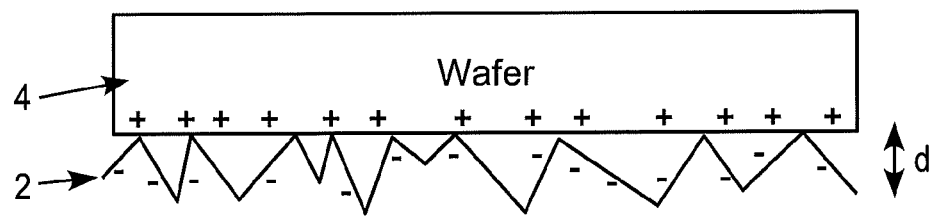
FIG. 1 is a schematic showing a rough ceramic surface of an electrostatic chuck (ESC) and a wafer backside in contact with the ESC surface.

Smoothening of the ESC surface due to repeated processing of wafers can also lead of residual sticking force. Due to differences between the coefficient of thermal expansion between Silicon and ESC ceramic, wafer surface grinds against the ESC ceramic when plasma heat load induces the heating of the wafer (and the consequent wafer expansion). Since the wafer is being held by the clamp force during processing, this grinding between the wafer and the ESC results in significant smoothening of the ESC ceramic upon extended use. Smoothened ceramic results in a significant increase in actual contact area between the wafer and the ESC. Further reduction of effective distance between the ESC surface and the wafer backside increase the clamp force due to any charge present at the interface since the force varies at $1/d^2$, where d is the distance between the wafer backside and the ceramic surface. Typically, the distance d is approximately equal to the roughness of the ESC surface (as shown in FIG. 1), so a smoother ESC surface results in a higher sticking force if any residual charge exists on the wafer surface. As mentioned previously, the residual charge may be present due to small amount of leakage current through the ESC ceramic or charge trapping by films on the ESC surface.

The residual sticking force on the wafer can lead to significant problems when the wafer is lifted up from the ESC surface including wafer popping, particle generation and even wafer breakage.

Disclosed herein is a method of removing residual sticking forces on the wafer after turning off the ESC clamp voltage to ensure robust dechucking such that issues associated with charge leakage in the ceramic, ceramic smoothening, film build up on the ceramic surface do not degrade wafer dechucking capability.

The method involves providing a plasma inside the holes for delivering a heat transfer gas such as He to the backside of the wafer only during the dechuck step after the clamp voltage has been switched off such that a dechucking plasma allows for neutralization of charge on the wafer backside.

FIG. 1 illustrates the residual forces between the rough ceramic surface 2 of an ESC and a wafer 4 after removal of the clamping voltage. The residual sticking force can lead to problems when the wafer is lifted up from the ESC surface such as wafer popping, particle generation and even wafer breakage.

Figure 2:
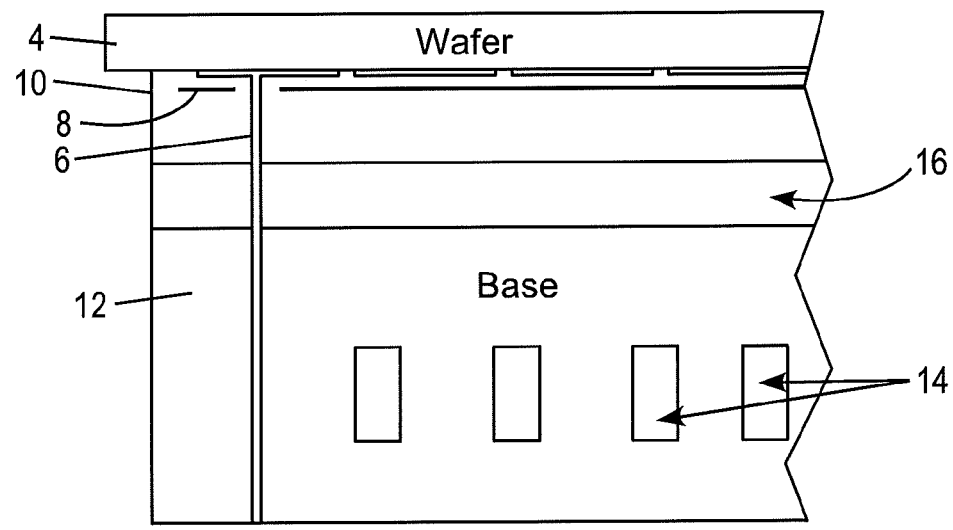
FIG. 2 is a schematic of an ESC assembly having an upper ceramic layer with embedded electrode, heater layer and baseplate with He delivery holes near a periphery of a wafer supported on the ceramic layer.

FIG. 2 shows an ESC construction wherein holes 6 near the ESC edge deliver He to the backside of the wafer. The ESC surface has a 1-10 mm seal zone at the outer edge such that a clamped wafer is able to sustain up to 100 Torr pressure difference between the wafer backside and the pressure in the plasma reactor. Additionally, the ESC surface has mesas or bumps distributed on its surface such that contact area between the wafer and the ESC surface is reduced significantly. There is a clamp electrode 8 embedded inside the ESC ceramic layer 10 that is connected to an external power supply to enable wafer clamping. The ESC ceramic 10 is bonded onto a cooling plate (baseplate) 12 and the cooling plate has coolant channels 14 such that temperature of the cooling plate can be controlled by connecting the cooling plate to a temperature control unit (chiller) which circulates fluid. The thermal resistance of the bond layer 16 between the ceramic and the cooling plate can be selected such that temperature difference between the ceramic and the cooling plate can be between 2 C and 90 C at 10 W/cm$^2$ heat flux into the wafer. In addition, heaters (not shown) may be embedded inside the ceramic or in between the ceramic and the bonding material to independently control the ceramic temperature.

Figure 3:
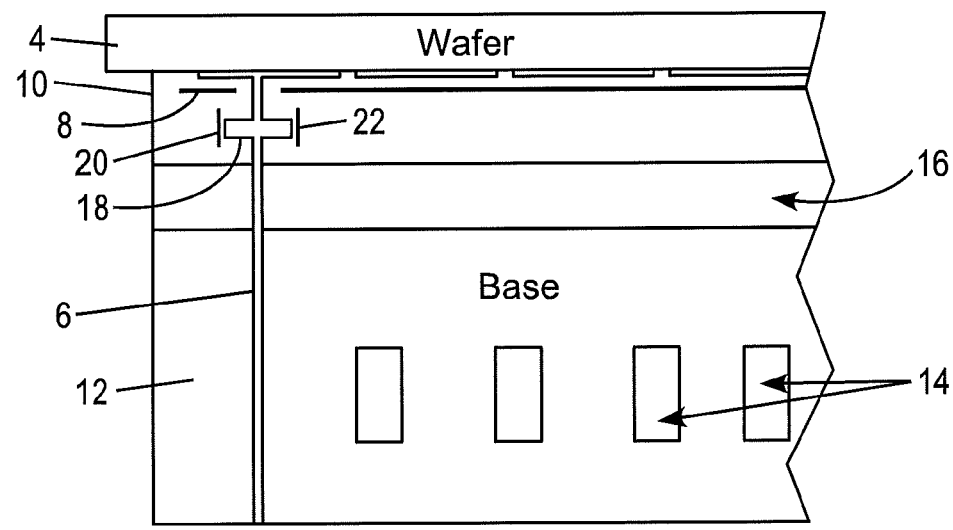
FIG. 3 is a schematic of an ESC assembly according to an embodiment wherein a cavity is provided for generating a dechucking plasma, the ESC assembly having an upper ceramic layer with embedded electrode, heater layer and baseplate with He delivery holes near a periphery of a wafer supported on the ceramic layer.

FIG. 3 shows an embodiment wherein a cavity 18 inside the ceramic of the ESC is in communication with the He delivery hole 6. A pair of electrodes 20, 22 is disposed on each side of the cavity 18 that are connected to an external DC or AC/RF power supply. During the plasma processing steps, the electrodes 20, 22 adjacent to the cavity 18 are kept electrically floating to the same potential such that no electric field exists in the cavity 18 in the radial direction. The height of the cavity 18 is chosen such that applied RF power during plasma processing does not sustain a discharge in the He channel in particular due to high pressure (10 Torr-100 Torr) in the cavity. Additionally, the electric field due to RF currents during the plasma processing are below those required to sustain the discharge. For example, 1 mm height cavity with 80 Torr He pressure requires approximately 1000V drop across the height of the cavity 18 to sustain a discharge based on the Paschen curve for He.

Figure 4:
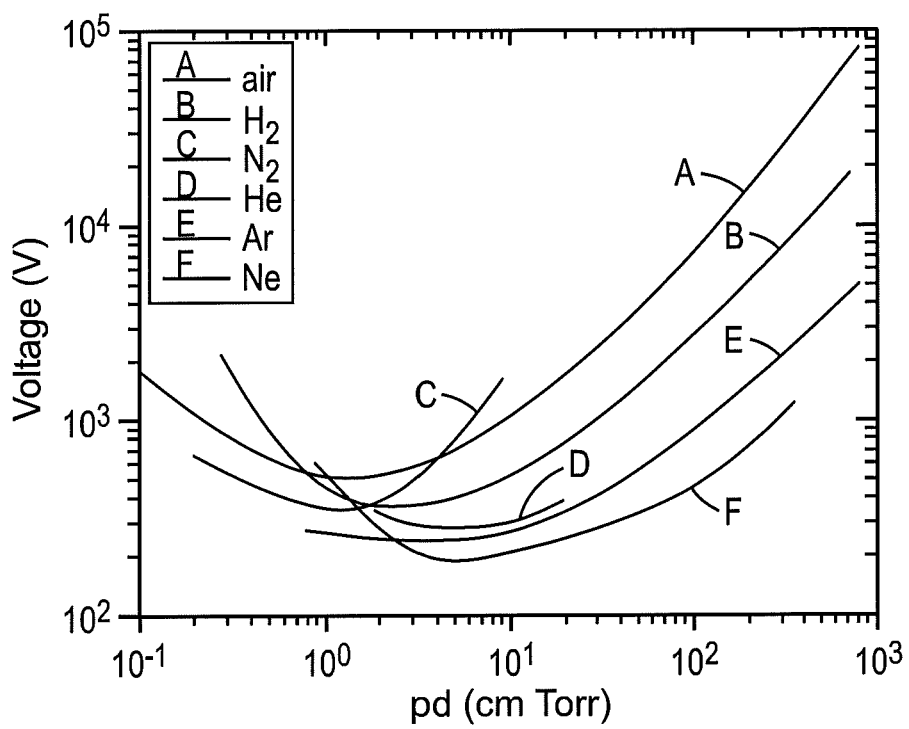
FIG. 4 is a graph of a Paschen curve for various gases illustrating the required minimum DC voltage across a gap to ignite a discharge in the gap as a function of pd (pressure in the cavity×cavity size in the direction of the electric field).

FIG. 4 is a graph of a Paschen curve for various gases showing the required minimum DC voltage across a gap to ignite a discharge in the gap as a function of pd (pressure in the cavity×cavity size in the direction of the electric field).

During the dechuck step, the power supply connected to the clamp electrode 8 is set to 0V (or other suitable voltage depending on the condition of the wafer) and the external power supply connected to the electrodes 20, 22 across the cavity 18 is turned on to provide a strong electric field in the radial direction. Additionally, He pressure on the wafer backside is reduced to a suitable range such as 1 to 10 Torr, preferably less than 5 Torr, by evacuating some of the He. The width of the cavity 18 is chosen to allow for pd in the cavity 18 to be close to the minimum of the Paschen curve such that discharge ignition can occur due to the applied field on the electrodes 20, 22 around the cavity 18. Additionally, a low RF power (<1000 W) can be applied to the wafer to help sustain the discharge in the cavity 18 during the dechuck step in presence of the radial electric field in the cavity. Weak plasma formation in the cavity allows for charge from the plasma to neutralize any charges on the wafer backside and the ESC surface in the edge seal area, thereby significantly reducing any residual sticking force.

Figure 5:
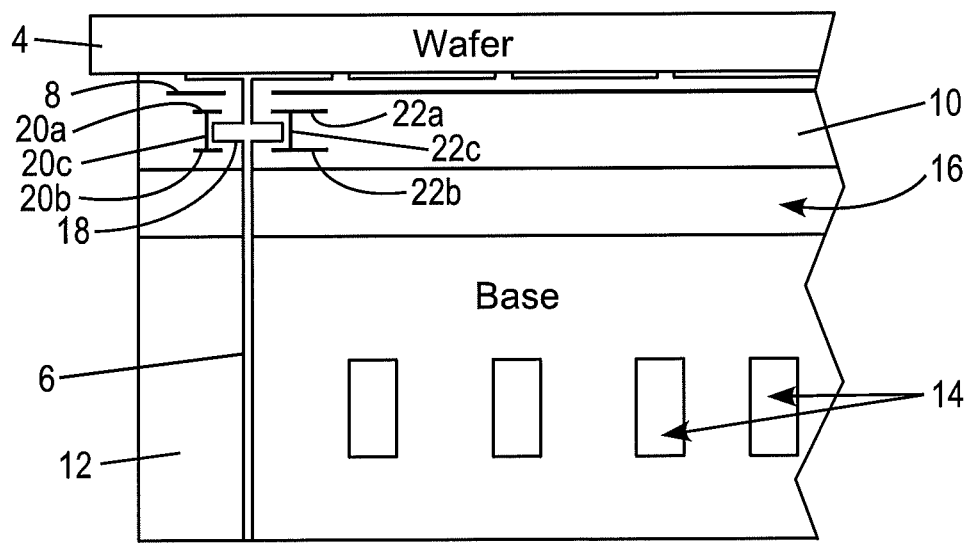
FIG. 5 is a schematic of an ESC assembly according to an embodiment wherein inner and outer electrodes are arranged on opposite sides of the cavity in which the dechucking plasma is formed.

FIG. 5 shows an embodiment wherein the electrodes on each side of the cavity 18 include upper planar electrodes 20a, 22a and lower planar electrodes 20b, 22b connected vertically by vias 20c, 22c (connection wires). An advantage of this embodiment is that it is easier to manufacture compared to cylindrical electrodes 20, 22 in FIG. 4.

Figure 6:
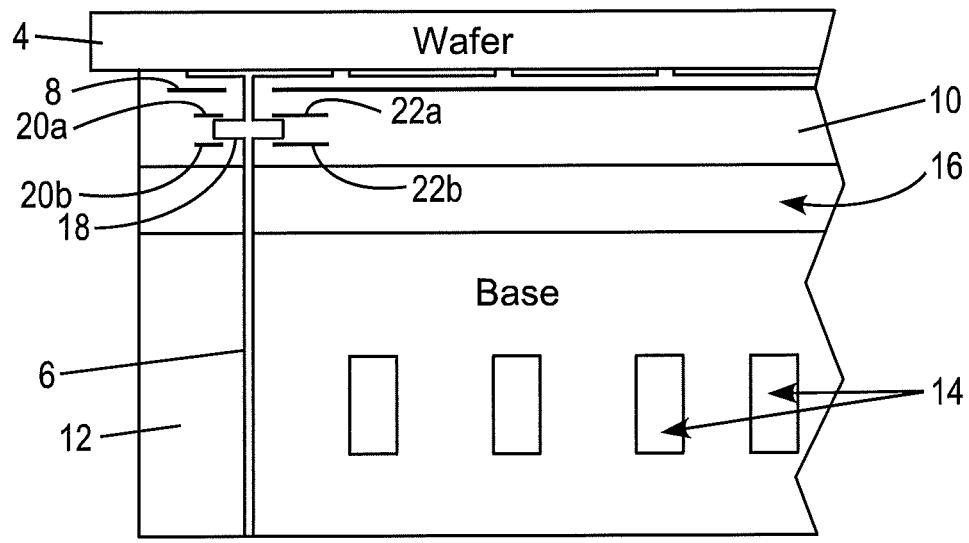
FIG. 6 is a schematic of an ESC assembly according to an embodiment wherein a pair of upper and a pair of lower electrodes are arranged on opposite sides of the cavity in which the dechucking plasma is formed.

FIG. 6 shows another embodiment wherein upper planar electrodes 20a, 22a and lower planar electrodes 20b, 22b are disposed above and below the cavity 18 such that electric field due to voltage difference across the electrodes is in the vertical direction. In this case, each electrode is a planar annulus with openings at the locations where He holes 6 are present.

Figure 7:
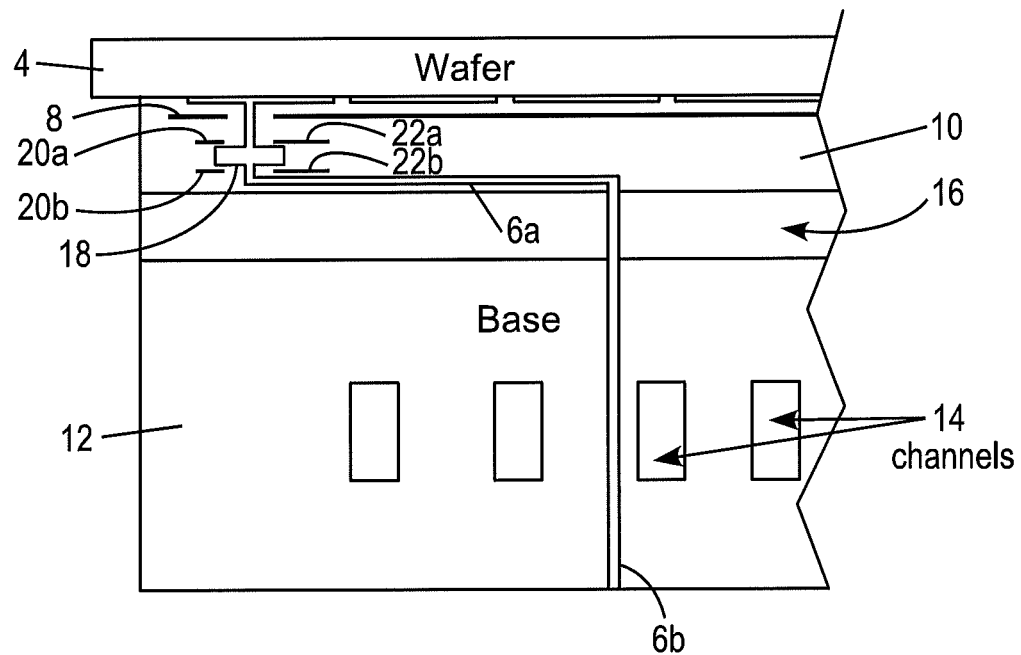
FIG. 7 is a schematic of an ESC assembly according to an embodiment wherein He is distributed to the cavity from a central axial passage and a plurality of radial passages.

FIG. 7 is an embodiment of FIG. 6 wherein radial passages 6a inside the ceramic 10 distribute He from a central axial passage 6b to all the He holes in the ESC. This configuration for He delivery can be combined with the dechucking electrode configurations for FIGS. 4 and 5 as well.

Figure 8:
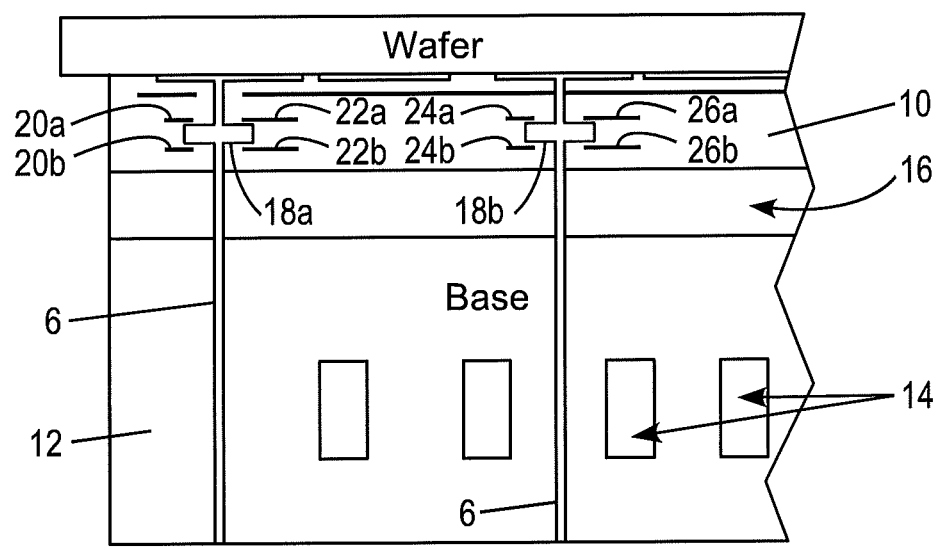
FIG. 8 is a schematic of an ESC assembly according to an embodiment wherein a dechucking plasma is delivered to inner and outer zones beneath a wafer.

FIG. 8 shows another embodiment wherein a dechucking plasma is supplied to inner and outer zones beneath the wafer. The ESC includes an outer cavity 18a and an inner cavity 18b with dechucking electrodes arranged on opposite sides of each cavity. Upper electrodes 20a, 22a and lower electrodes 20b, 22b are arranged above and below outer cavity 18a and upper electrodes 24a, 26a and lower electrodes 24b, 26b are arranged above and below inner cavity 18b. With this arrangement, the inner and outer zones can be maintained at different He pressures at the wafer backside. This scheme utilizes a seal zone near the ESC edge and another seal zone at a radius smaller than the ESC outer diameter to create 2 separate He zones. Such a configuration with a plurality of He zones can utilize a He cavities with electrodes disposed around them for every He zone. As shown previously, each He cavity can utilize the various dechucking electrode configurations described herein.

Maintaining the clamp electrode(s) during the dechuck step at same potential as the wafer prevents field from the electrodes around the channel to induce wafer clamping (due to the shielding effect from the clamp electrode).

The ESC described herein can be used with various ESC assemblies wherein the ESC (ceramic layer and embedded electrode, He holes, cavity and dechucking plasma electrodes) has a flat surface, mesa surface, single zone He ESC, dual zone He ESC, and various tunable ESCs with either monopolar or bipolar clamping scheme.

While an ESC with a continuous annular cavity 18 has been described, the ESC can be modified to include different cavity and dechucking electrode arrangements. For example, instead of a continuous annular cavity and continuous dechucking electrodes, the cavity could be segmented into smaller sections such as a cavity around each He hole with segmented dechucking electrodes or continuous dechucking electrodes on opposite sides of the segmented cavities.

The ESC can allow: (1) the use of a controlled plasma on the wafer backside during dechuck step to provide robust dechucking, (2) the ability to process wafers without having He lightup on the backside during processing steps, (3) the use of a combination of DC field and RF power to strike He discharge on the wafer backside, and/or (4) the ability to use a high DC field for sustaining the dechuck backside discharge.

In a method of dechucking, the heat transfer gas is helium and the dechucking plasma is formed by applying electrical power to a pair of electrodes arranged on opposite sides of the cavity 18. The cavity 18 can be a continuous annular cavity which is rectangular in cross section with a width at least 2 times, preferably at least 5 times greater than the height thereof. The cavity 18 can be in fluid communication with a plurality of vertical gas passages 6 extending between the cavity 18 and the support surface of the electrostatic chuck. The dechucking plasma can be formed by applying DC power to the electrodes sufficient to ignite the heat transfer gas into a plasma while supplying radiofrequency (RF) power to the electrodes sufficient to maintain the heat transfer gas in an ionized state. Alternatively, the RF power can be supplied to a baseplate of the ESC assembly.

In one arrangement, the pair of electrodes comprises an inner electrode along an inner periphery of the cavity and an outer electrode along an outer periphery of the cavity.

In another arrangement, the pair of electrodes comprises an inner electrode and an outer electrode. The inner electrode comprises parallel planar upper and lower inner rings interconnected by at least one vertical conductor located inward of an inner periphery of the cavity and the inner rings include outer portions located above and below an inner portion of the cavity. The outer electrode comprises parallel planar upper and lower outer rings interconnected by at least one vertical conductor located outward of an outer periphery of the cavity, the outer rings including portions located above and below an outer portion of the cavity. With this electrode arrangement, the inner and outer rings generate an electrical field predominantly in a radial direction.

In a further arrangement, the pair of electrodes comprises parallel planar upper and lower annular electrodes, the upper and lower annular electrodes including openings surrounding vertical gas passages extending from the cavity to the support surface.

In an arrangement wherein the chuck is a dual zone chuck which supplies helium to inner and outer zones beneath the wafer to independently control temperatures of the wafer across the inner and outer zones during plasma processing the wafer, dechucking can be carried out by supplying the dechucking plasma to the inner and outer zones.

What is claimed is:

1. A method of dechucking a wafer held on an electrostatic chuck, incorporated in a lower electrode in a plasma processing chamber, by electrostatic charge, the method comprising:
   clamping a wafer on a support surface of an electrostatic chuck in the plasma processing chamber by applying an electrostatic clamping voltage to the electrostatic chuck;
   subjecting the wafer to plasma processing while supplying a heat transfer gas at a pressure above 5 Torr to an underside of the wafer;
   extinguishing the plasma in the chamber and supplying the heat transfer gas at a pressure of 1 to 10 Torr;
   shutting off the electrostatic clamping voltage;
   forming a dechucking plasma in a cavity in the electrostatic chuck and neutralizing charges on the underside of the wafer and support surface of the electrostatic chuck with the dechucking plasma.

2. The method of claim 1, wherein the heat transfer gas is helium and the dechucking plasma is formed by applying electrical power to a pair of electrodes arranged on opposite sides of the cavity.

3. The method of claim 2, wherein the dechucking plasma is formed by applying DC power to the electrodes sufficient to ignite the heat transfer gas into a plasma while supplying radiofrequency power to the electrodes sufficient to maintain the heat transfer gas in an ionized state.

4. The method of claim 2, wherein the lower electrode includes a temperature controlled baseplate below the electrostatic chuck and the dechucking plasma is formed by applying DC power to the electrodes sufficient to ignite the heat transfer gas into a plasma while supplying radiofrequency power to the baseplate sufficient to maintain the heat transfer gas in an ionized state.

5. The method of claim 2, wherein the chuck is a dual zone chuck and the method including supplying helium to inner and outer zones beneath the wafer to independently control temperatures of the wafer across the inner and outer zones during plasma processing the wafer, and after extinguishing the plasma supplying the dechucking plasma to the inner and outer zones.

6. A method of dechucking a wafer held on an electrostatic chuck, incorporated in a lower electrode in a plasma processing chamber, by electrostatic charge, the method comprising:
   clamping a wafer on a support surface of an electrostatic chuck in the plasma processing chamber by applying an electrostatic clamping voltage to the electrostatic chuck;
   subjecting the wafer to plasma processing while supplying a heat transfer gas, wherein the heat transfer gas is helium at a pressure above 5 Torr to an underside of the wafer;
   extinguishing the plasma in the chamber and supplying the heat transfer gas at a pressure of 1 to 10 Torr;
   shutting off the electrostatic clamping voltage;
   forming a dechucking plasma in a cavity in the electrostatic chuck by applying electrical power to a pair of electrodes arranged on opposite sides of the cavity and neutralizing charges on the underside of the wafer and support surface of the electrostatic chuck with the dechucking plasma; and
   wherein the cavity is a continuous annular cavity which is rectangular in cross section, the cavity having a width at least 2 times greater than the height thereof, and the cavity is in fluid communication with a plurality of vertical gas passages extending between the cavity and the support surface of the electrostatic chuck.

7. The method of claim 6, wherein the pair of electrodes comprises an inner electrode along an inner periphery of the cavity and an outer electrode along an outer periphery of the cavity.

8. A method of dechucking a wafer held on an electrostatic chuck, incorporated in a lower electrode in a plasma processing chamber, by electrostatic charge, the method comprising:
clamping a wafer on a support surface of an electrostatic chuck in the plasma processing chamber by applying an electrostatic clamping voltage to the electrostatic chuck;
subjecting the wafer to plasma processing while supplying a heat transfer gas, wherein the heat transfer gas is helium at a pressure above 5 Torr to an underside of the wafer;
extinguishing the plasma in the chamber and supplying the heat transfer gas at a pressure of 1 to 10 Torr;
shutting off the electrostatic clamping voltage;
forming a dechucking plasma in a cavity in the electrostatic chuck by applying electrical power to a pair of electrodes arranged on opposite sides of the cavity and neutralizing charges on the underside of the wafer and support surface of the electrostatic chuck with the dechucking plasma; and
wherein the pair of electrodes comprises an inner electrode and an outer electrode, the inner electrode comprising parallel planar upper and lower inner rings interconnected by at least one vertical conductor located inward of an inner periphery of the cavity, the inner rings including outer portions located above and below an inner portion of the cavity and the outer electrode comprising parallel planar upper and lower outer rings interconnected by at least one vertical conductor located outward of an outer periphery of the cavity, the outer rings including portions located above and below an outer portion of the cavity, the inner and outer rings generating an electrical field predominantly in a radial direction.

9. A method of dechucking a wafer held on an electrostatic chuck, incorporated in a lower electrode in a plasma processing chamber, by electrostatic charge, the method comprising:
clamping a wafer on a support surface of an electrostatic chuck in the plasma processing chamber by applying an electrostatic clamping voltage to the electrostatic chuck;
subjecting the wafer to plasma processing while supplying a heat transfer gas, wherein the heat transfer gas is helium at a pressure above 5 Torr to an underside of the wafer;
extinguishing the plasma in the chamber and supplying the heat transfer gas at a pressure of 1 to 10 Torr;
shutting off the electrostatic clamping voltage;
forming a dechucking plasma in a cavity in the electrostatic chuck by applying electrical power to a pair of electrodes arranged on opposite sides of the cavity and neutralizing charges on the underside of the wafer and support surface of the electrostatic chuck with the dechucking plasma; and
wherein the pair of electrodes comprises parallel planar upper and lower annular electrodes, the upper and lower annular electrodes including openings surrounding vertical gas passages extending from the cavity to the support surface.

10. An electrostatic chuck assembly useful in a plasma processing chamber, comprising:
a support surface in a layer of ceramic material on which a semiconductor wafer is supported during processing of the wafer in the chamber;
at least one electrostatic clamping electrode embedded in the layer of ceramic material, the at least one electrostatic clamping electrode operable to apply an electrostatic clamping force to the wafer on the support surface when an electrostatic clamping voltage is applied to the clamping electrode;
at least one outlet in the support surface which delivers a heat transfer gas to an underside of the wafer;
at least one gas passage in the layer of ceramic material connected to a source of heat transfer gas operable to supply heat transfer gas at a desired pressure to the at least one gas passage;
at least one cavity and plasma generating electrode along the at least one gas passage, the plasma generating electrode operable to form a dechucking plasma in the cavity, the dechucking plasma being effective to neutralize charges on the underside of the wafer and support surface of the electrostatic chuck and thereby reduce a residual sticking force between the wafer and the support surface.

11. The electrostatic chuck assembly of claim 10, wherein a lower surface of the layer of ceramic material is bonded to an upper surface of a heater plate, a lower surface of the heater plate is bonded to an upper surface of a temperature controlled baseplate, and the plasma generating electrode comprises a pair of electrodes arranged on opposite sides of the cavity.

12. The electrostatic chuck assembly of claim 11, wherein the cavity is a continuous annular cavity which is rectangular in cross section, the cavity having a width at least 2 times greater than the height thereof, and the cavity is in fluid communication with a plurality of vertical gas passages extending between the cavity and the support surface of the electrostatic chuck.

13. The electrostatic chuck assembly of claim 12, wherein the pair of electrodes comprises an inner electrode along an inner periphery of the cavity and an outer electrode along an outer periphery of the cavity.

14. The electrostatic chuck assembly method of claim 11, further comprising a DC power source connected to the pair of electrodes, a radiofrequency (RF) power source connected to the pair of electrodes and a controller controlling supply of power from the DC and RF power sources such that the dechucking plasma is formed by applying sufficient DC power to the electrodes to ignite the heat transfer gas into a plasma while applying sufficient RF power to the electrodes to maintain the heat transfer gas in an ionized state.

15. The electrostatic chuck assembly of claim 11, wherein the pair of electrodes comprises an inner electrode and an outer electrode, the inner electrode comprising parallel planar upper and lower inner rings interconnected by at least one vertical conductor located inward of an inner periphery of the cavity, the inner rings including outer portions located above and below an inner portion of the cavity and the outer electrode comprising parallel planar upper and lower outer rings interconnected by at least one vertical conductor located outward of an outer periphery of the cavity, the outer rings including portions located above and below an outer portion of the cavity, the inner and outer rings generating an electrical field predominantly in a radial direction.

16. The electrostatic chuck assembly of claim 11, wherein the pair of electrodes comprises parallel planar upper and lower annular electrodes, the upper and lower annular electrodes including openings surrounding vertical gas passages extending from the cavity to the support surface.

17. The electrostatic chuck assembly of claim 11, further comprising a baseplate below the electrostatic chuck, a DC power source connected to the pair of electrodes, a radiofrequency (RF) power source connected to the baseplate and a controller controlling supply of power from the DC and RF power sources such that the dechucking plasma is formed by applying sufficient DC power to the electrodes to ignite the heat transfer gas into a plasma while applying sufficient RF power to the baseplate to maintain the heat transfer gas in an ionized state.

18. The electrostatic chuck assembly of claim 10, wherein the heat transfer gas supply supplies helium to the cavity and the cavity is an annular cavity in fluid communication with a plurality of helium gas passages extending from the cavity to the support surface.

19. The electrostatic chuck assembly of claim 10, wherein the chuck is a dual zone chuck operable to supply helium at independently controlled pressures to inner and outer zones beneath the wafer to independently control temperatures of the wafer across the inner and outer zones during plasma processing the wafer, and wherein the dechucking plasma is supplied to the inner and outer zones.

* * * * *